United States Patent
Ma

(10) Patent No.: US 11,317,537 B2
(45) Date of Patent: Apr. 26, 2022

(54) ELECTRONIC DEVICE WITH HEAT DISSIPATION MODULE

(71) Applicant: Lenovo (Beijing) Co., Ltd., Beijing (CN)

(72) Inventor: Fuxing Ma, Beijing (CN)

(73) Assignee: LENOVO (BEIJING) CO., LTD., Beijing (CN)

( * ) Notice: Subject to any disclaimer, the term of this patent is extended or adjusted under 35 U.S.C. 154(b) by 28 days.

(21) Appl. No.: 16/833,495

(22) Filed: Mar. 27, 2020

(65) Prior Publication Data

US 2020/0315056 A1    Oct. 1, 2020

(30) Foreign Application Priority Data

Mar. 29, 2019    (CN) .......................... 201910250064.X

(51) Int. Cl.
| | |
|---|---|
| *H05K 7/20* | (2006.01) |
| *H05K 5/00* | (2006.01) |
| *H05K 5/02* | (2006.01) |
| *H01B 7/42* | (2006.01) |
| *G06F 1/16* | (2006.01) |

(52) U.S. Cl.
CPC ........... *H05K 7/2039* (2013.01); *G06F 1/163* (2013.01); *H01B 7/421* (2013.01); *H05K 5/0017* (2013.01); *H05K 5/0247* (2013.01)

(58) Field of Classification Search
None
See application file for complete search history.

(56) References Cited

U.S. PATENT DOCUMENTS

| | | | | |
|---|---|---|---|---|
| 5,390,734 | A * | 2/1995 | Voorhes .................. | F28F 13/00 165/185 |
| 5,566,752 | A * | 10/1996 | Arnold .................... | F28F 13/00 165/185 |
| 5,798,907 | A * | 8/1998 | Janik ....................... | G06F 1/163 361/679.03 |
| 5,898,569 | A * | 4/1999 | Bhatia .................... | G06F 1/203 361/700 |
| 6,452,093 | B1 * | 9/2002 | Ishii ....................... | G06F 1/163 174/16.3 |
| 9,060,433 | B2 * | 6/2015 | Dangler ............... | H05K 1/0209 |
| 9,740,023 | B1 | 8/2017 | Ashwood | |
| 10,585,454 | B2 * | 3/2020 | Yuen ..................... | G06F 1/1628 |

(Continued)

FOREIGN PATENT DOCUMENTS

| | | |
|---|---|---|
| CN | 203801198 U | 8/2014 |
| CN | 106852067 A | 6/2017 |

(Continued)

*Primary Examiner* — Xanthia C Cunningham
(74) *Attorney, Agent, or Firm* — Anova Law Group, PLLC

(57) ABSTRACT

An electronic device includes a body having a receiving housing and an opening, a function module disposed in the receiving housing, a transmission module configured to transmit a signal between a first end of the transmission module and a second end of the transmission module, and a heat dissipation module disposed along the transmission module. The first end of the transmission module is located in the receiving housing, and the second end of the transmission module is located outside the receiving housing. The heat dissipation module is configured to transfer heat generated by the function module to the second end of the transmission module.

17 Claims, 5 Drawing Sheets

(56) References Cited

U.S. PATENT DOCUMENTS

| | | | | |
|---|---|---|---|---|
| 2003/0066637 A1* | 4/2003 | Zimman | ................ | H01L 23/57 |
| | | | | 165/185 |
| 2016/0135332 A1* | 5/2016 | Mann | .................. | H05K 7/2039 |
| | | | | 361/706 |
| 2016/0261037 A1* | 9/2016 | Chen | ....................... | H01Q 1/44 |
| 2018/0255636 A1* | 9/2018 | Seo | ..................... | G02B 27/017 |
| 2018/0317572 A1* | 11/2018 | Guttman | .............. | A41D 13/005 |

FOREIGN PATENT DOCUMENTS

| | | |
|---|---|---|
| CN | 107870423 A | 4/2018 |
| CN | 207783399 U | 8/2018 |
| CN | 207977136 U | 10/2018 |
| CN | 208297855 U | 12/2018 |

\* cited by examiner

ELECTRONIC DEVICE WITH HEAT DISSIPATION MODULE

CROSS-REFERENCE TO RELATED DISCLOSURE

This disclosure claims the priority to Chinese Patent Disclosure No. 201910250064.X, entitled "Electronic Device," filed on Mar. 29, 2019, the entire content of which is incorporated herein by reference.

TECHNICAL FIELD

The present disclosure relates to electronic technology, and in particular relates to an electronic device.

BACKGROUND

An electronic device often has a receiving housing and a function module, and a transmission module disposed in the receiving housing. The function module is often provided with a cooling component and dissipates heat through the cooling component. However, the cooling component often needs to be provided with multiple heat sinks in order to meet the heat dissipation requirements of the function module. Such designs can cause heavy weight of the electronic device and poor customer experience.

SUMMARY

According to one aspect of the present disclosure, an electronic device is provided. The electronic device includes a body having a receiving housing and an opening, a function module disposed in the receiving housing, a transmission module configured to transmit a signal between a first end of the transmission module and a second end of the transmission module, and a heat dissipation module disposed along the transmission module. The first end of the transmission module is located in the receiving housing, and the second end of the transmission module is located outside the receiving housing. The heat dissipation module is configured to transfer heat generated by the function module to the second end of the transmission module.

The above aspects will be described in detail with accompanying drawings.

Figure 1:
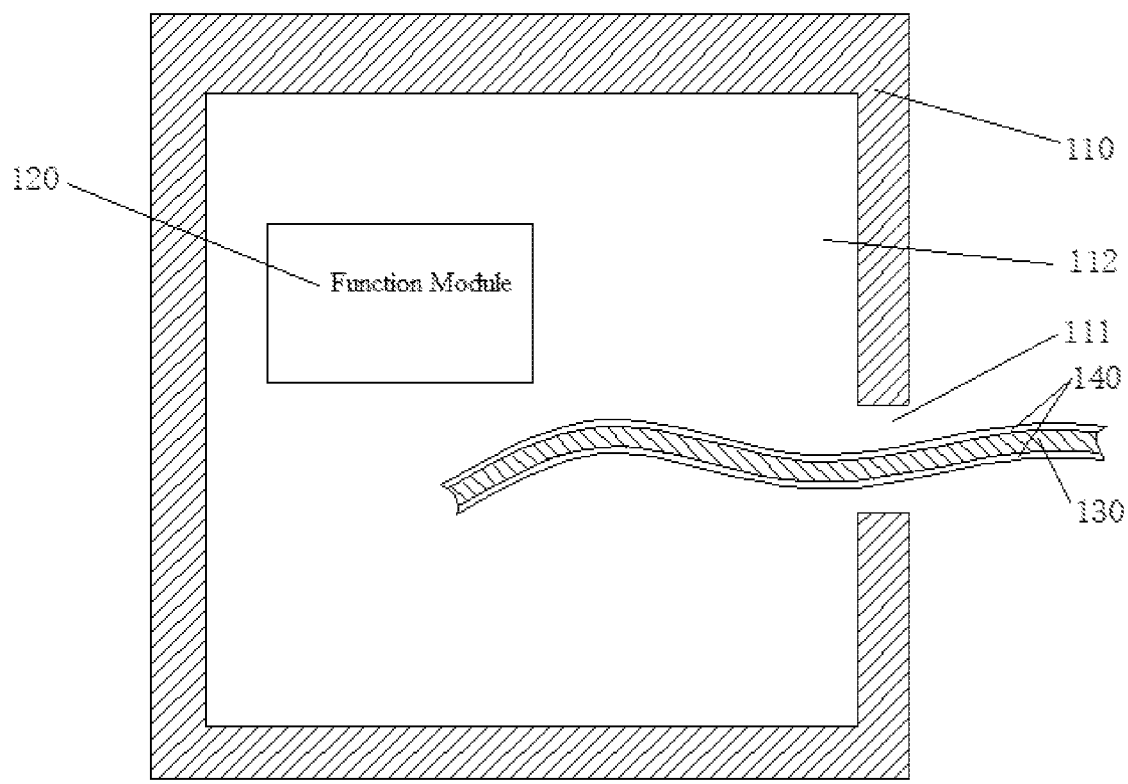
FIG. 1 is a schematic structural diagram of an electronic device according to one embodiment of the present disclosure.

Reference numerals: 110, body; 111, opening; 112, receiving housing; 120, function module; 130, transmission module; 140, heat dissipation module; 150, heat conduction module; 160, external module; 170, first heat conducting member; 180, second heat conducting member.

DETAILED DESCRIPTION OF THE EMBODIMENTS

The following describes the present disclosure in detail with reference to the drawings and specific embodiments. It should be understood that the specific embodiments described herein are only used to explain the disclosure, and are not used to limit the disclosure.

In the description of the embodiments of this disclosure, it should be noted that, unless otherwise stated and limited, the term "connection" should be understood in a broad sense. For example, it can be electrical connection, or internal connection of two elements, or it can be directly connected. It can also be indirectly connected through an intermediate medium. For those of ordinary skill in the art, the specific meanings of the above terms can be understood according to specific situations.

It should be noted that the terms "first\second\third" in the embodiments of the present disclosure are only used to distinguish similar objects, and do not represent a specific ordering of the objects. It can be understood that the particular order or sequential order of the "first\second\third" embodiments may be interchangeable among each other. It should be understood that the objects distinguished by "first\second\third" embodiments may be interchangeable where appropriate, so that the embodiments of the present disclosure described herein can be implemented in an order other than those illustrated or described herein.

The electronic device described in the embodiments of the present disclosure will be described in detail below with reference to FIGS. 1 to 5.

The electronic device may include: a main body 110 having a receiving housing 112 with at least one opening 111; a function module 120 disposed in the receiving housing 112 that can generate heat; a transmission module 130 configured to transmit signals between a first end of the transmission module 130 and a second end of the transmission module 130. The first end of the transmission module 130 is located in the receiving housing 112 and the second end of the transmission module 130 is located outside the receiving housing 112 or at an opening 111. The heat dissipation module 140 is disposed along the transmission module 130 and may be configured to direct at least part of heat generated by the function module 120 to the second end of the transmission module 130.

In the embodiments of the present disclosure, the structure of the electronic device is not limited. For example, the electronic device may be a computer, a mobile phone, or a wearable visual device. As an example, the electronic device may be a head-mounted visual device.

In the embodiments of the present disclosure, a structure and a shape of the body 110 may not be limited, as long as the body 110 has a receiving housing 112 and at least one opening 111. As an example, the body 110 may be a housing of a wearable visual device.

A shape and structure of the receiving housing 112 may not be limited. Those skilled in the art can set the shape and structure of the receiving housing 112 according to actual needs.

At least one opening 111 is connected to the receiving housing 112. A number of the at least one opening 111 may be one, or two or more. As an example, as shown in FIGS. 1 to 4, the number of the opening 111 is one.

In the embodiments of the present disclosure, the manner in which the function module 120 generates heat may not be limited. The function module 120 may generate heat by itself, or may generate heat by absorbing the heat of other heat generating components. For example, the function module 120 may be an electronic component. During the operation of the function module 120, a part of the electric energy is converted into heat that is dissipated. For example, the function module 120 may be a moving mechanical component, and the mechanical component generates heat and dissipates heat during the movement. As another example, the function module 120 may be a structural component, and the structural component abuts the electronic component or the moving mechanical component, and generates heat by absorbing the heat from the electronic component or the moving mechanical component.

In the embodiments of the present disclosure, a portion of the heat dissipation module 140 corresponds to a position of the second end of the transmission module 130, so that the heat dissipation module 140 exchanges at least part of the heat generated by the function module 120 with an external environment at the first portion of the transmission module 130. For example, a portion of the heat dissipation module 140 may be fixed on the second end of the transmission module 130. For example, there may be a set gap between the portion of the heat dissipation module 140 and the second end of the transmission module 130.

A disposition of the heat dissipation module 140 along the transmission module 130 is a disposition of the heat dissipation module 140 along a direction from the first end of the transmission module 130 to the second end of the transmission module 130. It should be noted that the disposition of the heat dissipation module along the transmission module 130 may be a disposition of the entire heat dissipation module 140 along the transmission module 130, or may be a disposition of a part of the heat dissipation module 140 along the transmission module 130.

Figure 2:
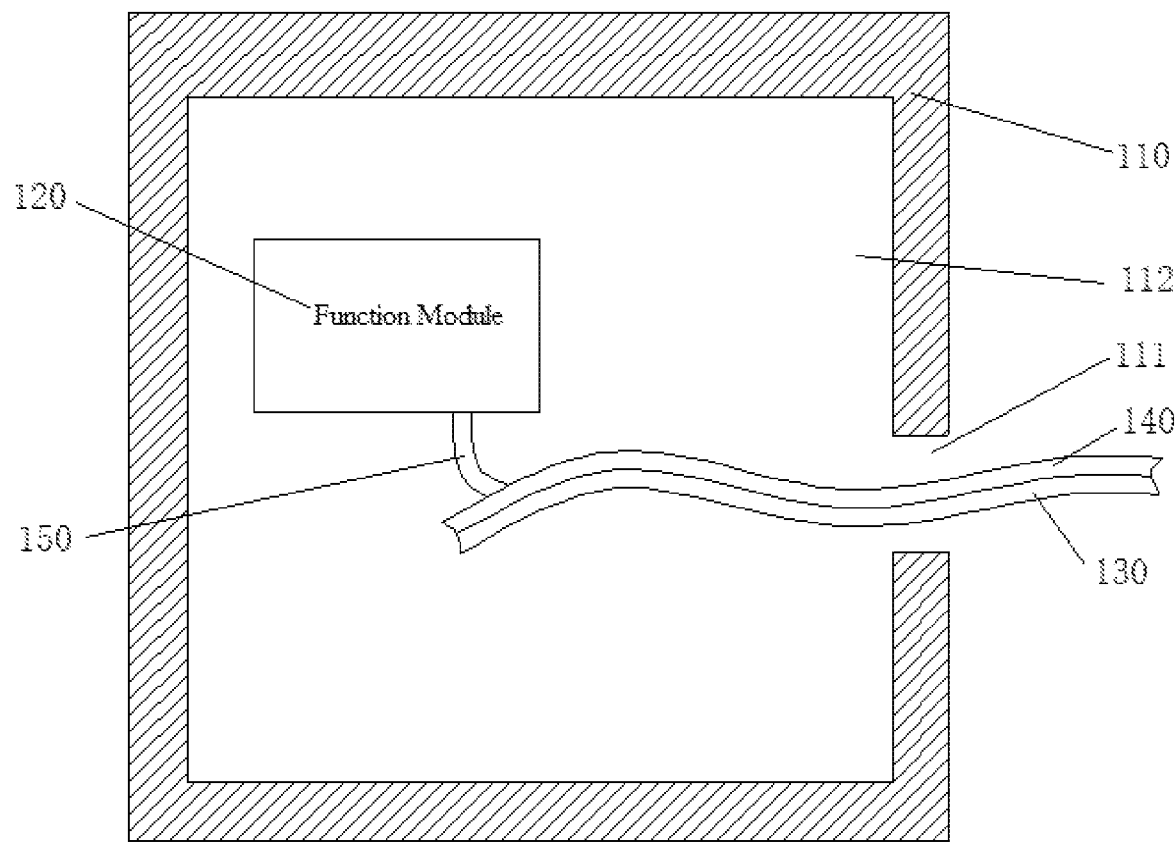
FIG. 2 is a schematic structural diagram of the electronic device according to another embodiment of the present disclosure.

The positions of the heat dissipation module 140 and the transmission module 130 may not be limited. For example, the heat dissipation module 140 and the transmission module 130 may be disposed in parallel, as shown in FIG. 2. In another example, the heat dissipation module 140 covers an outside of the transmission module 130, as shown in FIG. 1. In another example, the transmission module 130 covers the outside of the heat dissipation module 140. The heat dissipation module 140 may abut the transmission module 130, or there may be a gap between them.

In some embodiments, the first end of the heat dissipation module 140 may abut or be connected to the function module 120, the second end of the heat dissipation module 140 is fixed on the second end of the transmission module 130, and a middle of the heat dissipation module 140 is fixed on the transmission module 130. As such, the first end of the heat dissipation module 140 absorbs the heat generated by the function module 120 and based on the transmission module 130, transfers the heat to the second end of the transmission module 130 through the middle of the heat dissipation module 140.

In some embodiments as shown in FIG. 1, the first end of the heat dissipation module 140 is fixed on the first end of the transmission module 130, or the first end of the heat dissipation module 140 is fixed on the middle of the transmission module 130. There is a first distance between the first end of the heat dissipation module 140 and the function module 120, and the second end of the heat dissipation module 140 is fixed on the second end of the transmission module 130. Accordingly, the first end of the heat dissipation module 140 absorbs the heat generated by the function module 120 and based on the transmission module 130, transfers the heat to the second end of the transmission module 130 through the middle of the heat dissipation module 140.

Of course, the electronic device may further include: a heat conduction module 150 disposed in the receiving housing 112, abutting or being connected to the function module 120, and abutting or being connected to the heat dissipation module 140; and transfers the heat generated by the function module 120 to the heat dissipation module 140 through the heat conduction module 150. In one embodiment, as shown in FIG. 2, the first end of the heat dissipation module 140 is fixed to the first end of the transmission module 130, or the first end of the heat dissipation module 140 is fixed to the middle of the transmission module 130. The first end of the heat dissipation module 140 abuts or is connected to the function module 120 through the heat conduction module 150, and the second end of the heat dissipation module 140 is fixed to the second end of the transmission module 130. As such, the first end of the heat dissipation module 140 absorbs the heat generated by the function module 120 through the heat conduction module 150 and based on the transmission module 130, transfers the heat to the second end of the transmission module 130 through the middle of the heat dissipation module 140.

In one example of the embodiments of the present disclosure, the electronic device may include a transmission device, and the transmission device includes the transmission module 130 and the heat dissipation module 140 that are associated with each other.

In this example, the structure of the transmission device may not be limited. For example, the transmission device may be a cable or an optic cable.

In this example, the association between the transmission module 130 and the heat dissipation module 140 may refer to a spatial relationship between the transmission module 130 and the heat dissipation module 140, or the transmission module 130 and the heat dissipation module 140 may be related both in location and function.

The spatial relationship between the transmission module 130 and the heat dissipation module 140 may be that the transmission module 130 and the heat dissipation module 140 are disposed side by side, or the transmission module 130 covers an outside of the heat dissipation module 140, or the heat dissipation module 140 covers the outside of the transmission module 130.

The functional relationship between the transmission module 130 and the heat dissipation module 140 may be that the heat dissipation module 140 is configured to reduce an interference through the heat dissipation module during a signal transmission process of the transmission module 130. The heat dissipation module 140 reducing the interference through the heat dissipation module 140 may be that the heat dissipation module 140 reduces interference from an external environment to the transmission signal of the transmission module 130, and or may be that the heat dissipation module 140 reduces the interference from the transmission module 130 to the external environment.

In one embodiment, the transmission device may a cable or an optical cable. The transmission module 130 may be a wire core of the cable or the optical cable, and the heat dissipation module 140 may be a shielding layer that covers the wire core. At this time, the shielding layer can both dissipate heat to a function component and shield the wire core.

Figure 3:
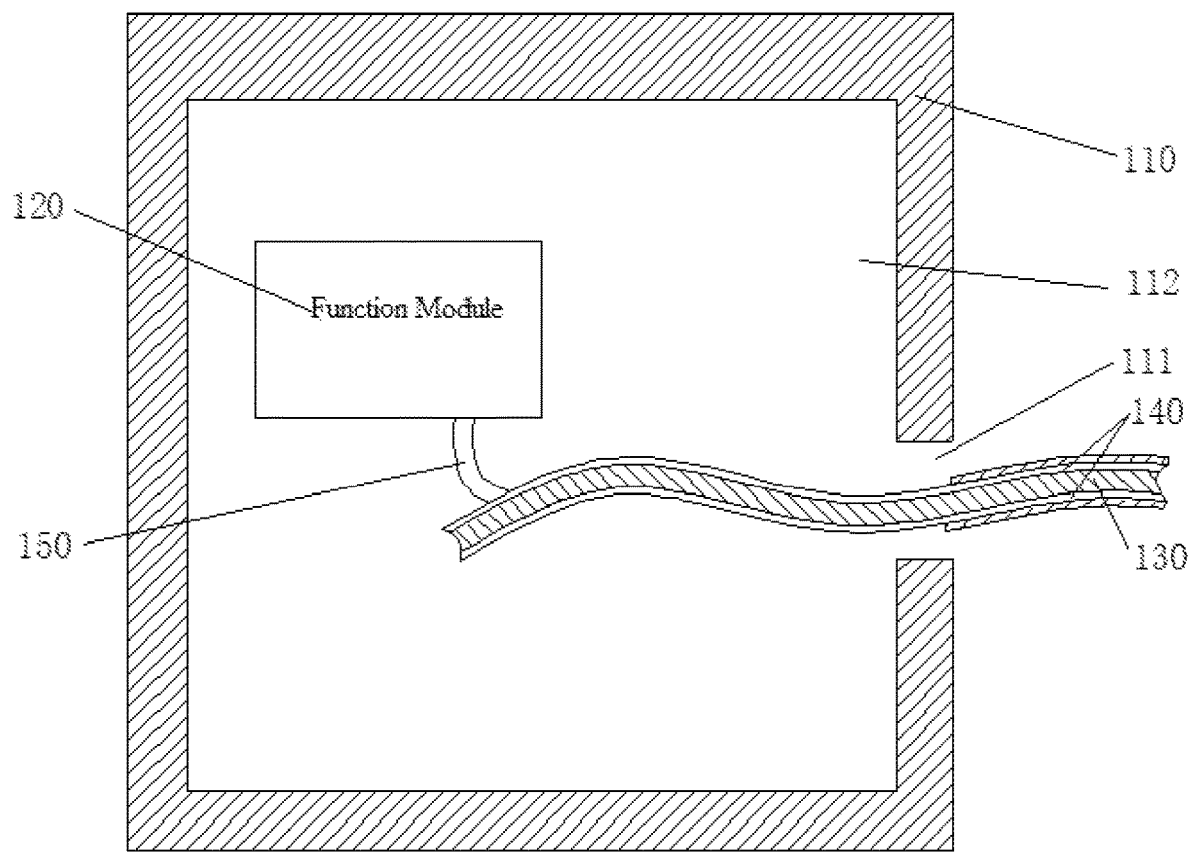
FIG. 3 is a schematic structural diagram of the electronic device according to another embodiment of the present disclosure.

In one example of the embodiments of the present disclosure, when the second end of the transmission module 130 passes through the opening 111 and is located outside the receiving housing 112, as shown in FIG. 3, the electronic device may further include: an external module 160 disposed outside the receiving housing 112 and covering the outside of the heat dissipation module 140, at least to reduce a contact between the heat dissipation module 140 and the external environment, thereby protecting the heat dissipation module 140 and preventing the heat dissipation module 140 from abrasion.

In this example, the external module 160 may only cover the outside of the heat dissipation module 140 or cover the outside of the heat dissipation module 140 and the transmission module 130.

In one example, the heat dissipation module 140 and the transmission module 130 may be disposed side by side, the external module 160 may only cover the outside of the heat dissipation module 140, and the external module 160 may be configured to only reduce the contact between the heat dissipation module and the external environment.

In another example, the heat dissipation module 140 may cover the outside of the transmission module 130, the heat dissipation module 140 structure has no gap, and the external module 160 may cover the outside of the transmission module 130. The external module 160 is configured to only reduce the contact between the heat dissipation module and the external environment.

In another example, the heat dissipation module 140 and the transmission module 130 may be disposed side by side, and the external module 160 may simultaneously cover the outside of the heat dissipation module 140 and the transmission module 130. The external module 160 may be configured to reduce the contact between the heat dissipation module and the external environment, and the contact between the transmission module and the external environment.

In further example, the heat dissipation module 140 may cover the outside of the transmission module 130, the heat dissipation module 140 may be a mesh structure having gaps, and the external module 160 may cover the outside of the heat dissipation module 140 and the transmission module. The external module 160 may be configured to reduce the contact between the heat dissipation module and the external environment and the contact between the heat dissipation module and the external environment.

In order to improve the heat dissipation capacity of the heat dissipation module 140, a heat dissipation structure may be disposed at the external module 160.

In one embodiment, a heat dissipation path may be disposed at the external module 160, so that at least a part of the heat dissipation module 140 in the external module 160 can exchange heat with the external environment through the heat dissipation path. Of course, the external module 160 may not be provided with a heat dissipation path.

Figure 4:
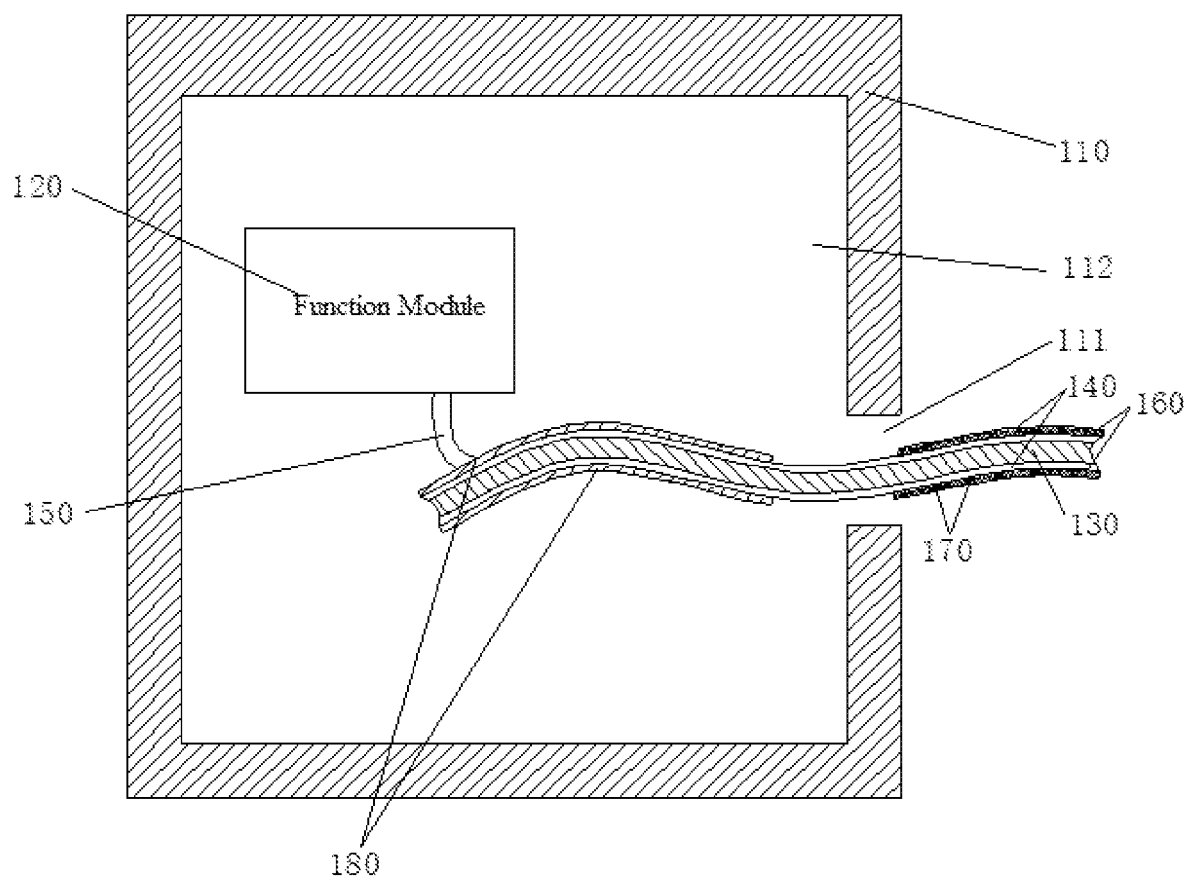
FIG. 4 is a schematic structural diagram of the electronic device according to another embodiment of the present disclosure.
Figure 5:
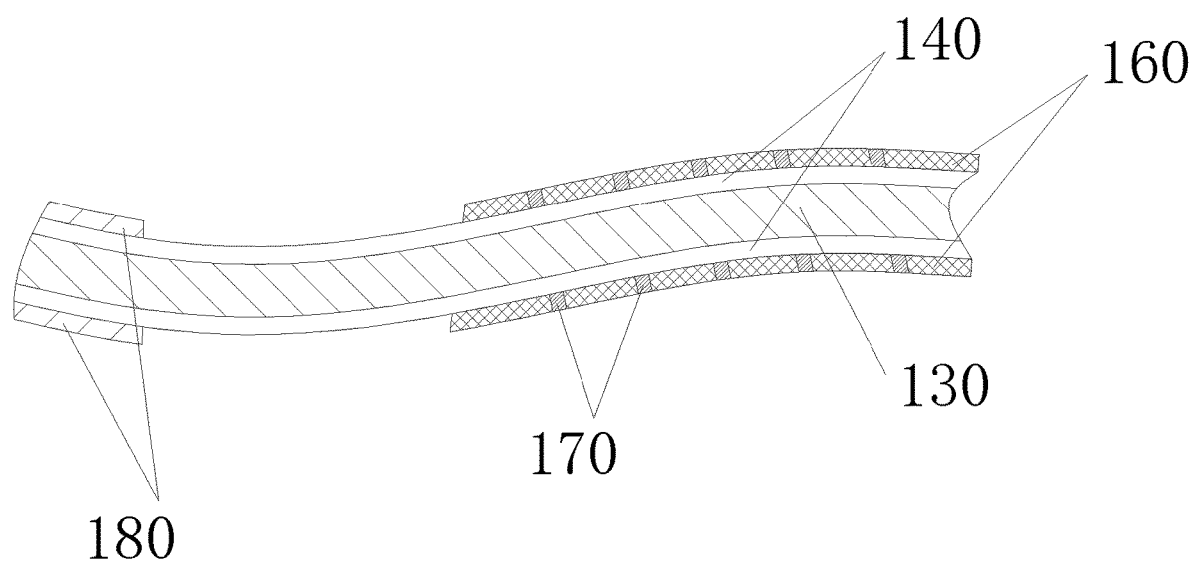
FIG. 5 illustrates a partial cross-sectional structural view of the electronic device according to some embodiments of the present disclosure.

In this embodiment, a shape of the heat dissipation path may not be limited. For example, the heat dissipation path may be a through hole disposed in the external module 160. The number of the heat dissipation paths may also not be limited. For example, there may be one heat dissipation path, or at least two. As an example, the number of the heat dissipation paths is at least two. At least two heat dissipation paths are annually disposed along a circumferential direction of the external module 160 with an interval, as shown in FIGS. 4 and 5. As another example, the heat dissipation path is spirally disposed along the circumferential direction of the external module 160 to form a continuous heat dissipation path in a length direction of the external module 160, to improve heat dissipation efficiency. A structure of the external module 160 is also a continuous structure with no disconnected parts, which improves the capacity of the external module 160 to protect the heat dissipation module 140.

In this embodiments, at least a part of the heat dissipation module 140 can be directly connected to the outside environment through the heat dissipation path; that is, at least a part of the heat dissipation module 140 is exposed to the external environment, so that the heat dissipation capacity of the dissipation module 140 can be improved. Of course, the heat dissipation path may also be disposed in a structure that facilitates heat conduction.

In some embodiments, as shown in FIG. 4, the electronic device may further include a first heat conducting member 170 disposed in the heat dissipation path, and at least a part of the heat dissipation module 140 exchanges heat with the external environment through the first heat conducting member 170, to improve the heat dissipation capacity of the heat dissipation module 140 through the first heat conducting member 170.

The material of the first heat conducting member 170 may not be limited as long as the first heat conducting member 170 facilitates the heat conduction. For example, the first heat-conducting member 170 may be made of a material having a low thermal resistance and a good thermal conductivity. For example, the first heat conducting member 170 may be made of a graphite material.

The first heat-conducting member 170 may completely fill the heat dissipation path, or may fill a part of the heat dissipation path.

In some embodiments of the present disclosure, as shown in FIG. 4, the electronic device may further include: a second heat conducting member 180 disposed in the receiving housing 112 and covers the outside of the heat dissipation module 140, so that the heat dissipation module 140 absorbs the heat in the receiving housing 112 through the second heat conducting member 180. The heat may be generated by the function module 120, or other components in the receiving housing 112. As such, heat absorbing capacity of the heat dissipation module 140 can by improved through the second heat conducting member 180.

In this embodiment, the material of the second heat conducting member 180 may not be limited as long as the second heat conducting member 180 facilitates heat conduction. For example, the second heat conducting member 180 may be made of a material having a low thermal resistance and good thermal performance. As an example, the first heat conducting member 170 may be made of a graphite material.

The second heat-conducting member 180 may cover the heat dissipation module 140 entirely in the receiving housing 112, or may cover a portion of the heat dissipation module 140 in the receiving housing 112.

It should be noted that when the electronic device further includes a heat conduction module 150, the heat conduction module 150 may abut or be connected to the function module 120, and may abut or be connected to the second heat conducting member 180. The heat conduction module can transfer the heat generated by the function module to the second heat conducting member 180 and then transfer the heat to the heat dissipation module 140 through the second heat conducting member 180. At this time, the heat dissipation module 140 can dissipate heat generated by the function module 120 and other heat-generating components in the receiving housing 112, as shown in FIG. 4.

In some embodiments, the body 110 may be a shell of an electronic device. At least one opening is disposed at the shell, and a first interface is disposed at the at least one opening. The first interface is configured to be connected to a first device. A function component may be disposed at the receiving housing of the shell. The transmission module 130 and the heat dissipation module 140 are extensions of the interface. A first end of the extension of the interface is electrically connected to the function component, and a second end of the extension of the interface is electrically connected to the first interface so that the interface of the function component can be moved to the at least one opening of the shell through the extension of the interface. The function module 120 may be a function component, or may be another component that generates heat being disposed in the receiving housing of the shell.

As an example, the electronic device may be a case hosting a desktop computer, and the function component is a main board. The first interface that is electrically connected to the computer through the extension of the interface is disposed at a first side of the case. A second interface that is directly electrically connected to the main board is disposed at a second side of the case. The first interface may be a headphone interface, or a universal serial bus (USB) interface. The function module 120 may be a main board or a processor.

In one embodiment of the present disclosure, the electronic device may further include: a display module connected to the body 110, being configured to display content; and a wearable body connected to the body 110, being configured to maintain a relative spatial relationship between the body 110 and a wearer's head. When the wearer wears the electronic device through the wearable body, a display light of the display module is within sight of the wearer.

In this embodiment, the electronic device is a wearable device, and the weight of the wearable device needs to as light as possible in order to improve the wearing experience of customers. In the present disclosure, since the second end of the transmission module 130 is located outside the receiving housing or at the opening of the receiving house, the heat dissipation module 140 can exchange at least part of the heat generated by the function module 120 with the external environment at the second end of the transmission module 130, to reduce a temperature of the function module 120 thereby reducing a temperature of the wearable device. Accordingly, the wearable device can meet the heat dissipation requirement without a cooler or only a small cooler, which can effectively reduce the weight of the wearable device and improve the customer experience.

In this embodiment, the display module is configured to output display content, so that the wearer can see the display content through the display module. A structure of the display module may not be limited as long as it can output the display content. For example, the display module may include a display screen.

In this embodiment, the wearable body is configured to maintain the relative spatial relationship between the body 110 and the wearer's head, so that when the wearer wears the electronic device through the wearable body, the display light of the display module is stably within the sight of the wearer, which facilitates wearer to watch the display content of the display module. The structure of the wearable body may not be limited. For example, the wearable body may be a fixed rope.

In some embodiments, the body 110 may be a shell of the wearable device, and at least one opening is disposed at the shell. A function component is disposed in a receiving housing of the shell. The transmission module 130 and the heat dissipation module 140 are transmission wires. A first end of the transmission wire is electrically connected to the function component, the second end of the transmission wire extends out of the shell through the at least one opening. The second end of the transmission wire is configured to be electrically connected to a first device, so that the wearable device can transmit information to the first device based on the function component. The function module 120 may be a function component, or may be another component that generates heat being disposed in the receiving housing of the shell.

As an example, the electronic device may be a head-mounted visual device, the body 110 may be a shell of the head-mounted visual device, and an opening may be disposed at the shell. The function component may be a main board disposed in a receiving housing of the shell. The function module 120 and the transmission module 130 may form a transmission wire. The first end of the transmission wire is electrically connected to the main board. The second end of the transmission wire extends out of the shell through the opening of the shell. The second end of the transmission wire is configured to be connected to the first device. The display module is electrically connected to the main board, to control the display content of the display module based on the first device. The function module 120 may be a main board, or may be other component that generates heat being disposed in the receiving housing of the shell. The first device here may be a computer, a mobile phone, or other devices with processing functions.

The display module may be a display screen of the head-mounted visual device, and the wearing body may be a fixed rope for the head-mounted visual device.

In this embodiment of the present disclosure, the electronic device includes a transmission module 130 and a heat dissipation module 140. The heat dissipation module 140 is disposed along the transmission module 130 and can be configured to transfer at least part of the heat generated by the function module 120 to the heat dissipation module 140. The second end of the transmission module 130 is located outside the receiving housing 112 or at an opening 111, the heat dissipation module 140 can transfer at least part of the heat generated by the function module 120 to the external environment at the second end of the transmission module 130, to reduce the temperature of the function module 120, thereby reducing the temperature of the electronic device. As such, the electronic device may not be provided with a cooler or only needs to be provided with a cooler to meet the heat dissipation requirement, which can effectively reduce the weight of electronic device and improve the customer experience.

The above are only specific embodiments of the disclosure, but the scope of the disclosure is not limited to this. Any changes or substitutions within the technical scope of the disclosure made by any person skilled in the art should be covered by the scope of the disclosure. Therefore, the scope of the disclosure shall conform to the scope of the appended claims.

What is claimed is:

1. An electronic device, comprising:
a body having a receiving housing and an opening;
a function module disposed in the receiving housing;
a transmission module configured to transmit a signal between a first end of the transmission module and a second end of the transmission module, the first end of the transmission module being located in the receiving housing, the second end of the transmission module being located outside the receiving housing; and a heat dissipation module configured to transfer heat generated by the function module to the second end of the transmission module, wherein a first end of the heat dissipation module abuts or is connected to the function module, a second end of the heat dissipation module is fixed on the second end of the transmission module, and the heat dissipation module is fixed on the transmission module.

2. The electronic device according to claim 1, further comprising:
a transmission device including the transmission module and the heat dissipation module.

3. The electronic device according to claim 2, wherein the heat dissipation module covers an outside of the transmission module.

4. The electronic device according to claim 1, wherein:
the heat dissipation module is configured to reduce interference by the heat dissipation module during a signal transmission process of the transmission module.

5. The electronic device according to claim 1, further comprising:
a heat conduction module disposed in the receiving housing, abutting or being connected to the function module, and abutting or being connected to the heat dissipation module, the heat conduction module being configured to transfer heat generated by the function module to the heat dissipation module.

6. The electronic device according to claim 1, further comprising:
an external module disposed outside the receiving housing, covering an outside of the heat dissipation module, being configured to reduce a contact between the heat dissipation module and the external environment, wherein:
the second end of the transmission module is located outside the receiving house through the opening; and
a heat dissipation path is disposed at the external module, a portion of the heat dissipation module in the external module dissipating heat with external environment through the heat dissipation path.

7. The electronic device according to claim 6, wherein:
at least the portion of the heat dissipation module is connected to the external environment through the heat dissipation path; or,
the electronic device further comprises:
a first heat conducting member disposed in the heat dissipation path, at least a part of the heat dissipation module exchanging heat with the external environment through the first heat conducting member.

8. The electronic device according to claim 7, wherein the first heat conducting member is made of a material having a low thermal resistance and a high thermal conductivity.

9. The electronic device according to claim 6, wherein:
at least two heat dissipation paths are disposed along a circumferential direction of the external module at an interval; or, the heat dissipation paths are spirally disposed along the circumferential direction of the external module.

10. The electronic device according to claim 1, further comprising:
a second heat-conducting member disposed in the receiving housing, covering the outside of the heat dissipation module so that the heat dissipation module absorbs heat from the receiving housing through the second heat conducting member.

11. The electronic device according to claim 1, wherein the electronic device is a head-mounted display device and further comprises:
a display screen connected to the body, configured to output display content; and
a wearable component connected to the body, configured to maintain a relative spatial relationship between the body and a head of a wearer;
wherein a display light of the display module is within a sight of the wearer when the wearer wears the electronic device through the wearable component.

12. The electronic device according to claim 1, wherein:
the function module is a moving mechanical component that generates and dissipates heat when the mechanical component is moving.

13. The electronic device according to claim 1, wherein:
the heat dissipation module abuts the transmission module; or
a gap is located between the heat dissipation module and the transmission module.

14. The electronic device according to claim 1, wherein:
the first end of the heat dissipation module is fixed on the first end of the transmission module; and
a first distance is located between the first end of the heat dissipation module and the function module.

15. The electronic device according to claim 1, wherein:
the heat dissipation module and the transmission module are disposed side by side, and an external module disposed outside the receiving housing covers an outside of the heat dissipation module.

16. The electronic device according to claim 1, wherein:
the body is a shell of the electronic device;
a first interface is disposed at the opening of the body, and is connected to a first device; and
the transmission module and the heat dissipation module are extended wires of the interface.

17. The electronic device according to claim 16, wherein:
the electronic device is a case hosting a desktop computer, the first interface is a headphone interface or a universal serial bus (USB) interface, and the function module is a processor.

* * * * *